United States Patent
Scarlata

(10) Patent No.: US 6,188,332 B1
(45) Date of Patent: Feb. 13, 2001

(54) APPARATUS FOR MAGNETICALLY TRANSFERING CONTROL INFORMATION FROM A ROTARY KNOB

(75) Inventor: Stephen J. Scarlata, Hopkinton, MA (US)

(73) Assignee: Alto Technologies, Inc., Sterling, MA (US)

( * ) Notice: Under 35 U.S.C. 154(b), the term of this patent shall be extended for 0 days.

(21) Appl. No.: 09/228,120

(22) Filed: Jan. 11, 1999

(51) Int. Cl.⁷ ................................... H03K 17/94
(52) U.S. Cl. .................. 341/35; 341/32; 200/19.07; 345/184; 324/207.25
(58) Field of Search ............... 341/32, 35; 345/184; 200/19.07; 324/207.25, 207.13

(56) References Cited

U.S. PATENT DOCUMENTS 4,415,856 * 11/1983 Welles .................... 324/207.13
5,592,079 * 1/1997 Scheel ..................... 324/207.25

* cited by examiner

Primary Examiner—Michael Horabik
Assistant Examiner—Timothy Edwards, Jr.
(74) Attorney, Agent, or Firm—Mirick, O'Connell, DeMallie, & Lougee, LLP

(57) ABSTRACT

An apparatus for magnetically transferring control information from a rotary knob with a knob mounted in a manner which facilitates rotation, a magnetic material about the circumference of the knob with alternating field lines perpendicular to the direction of knob rotation, a magnetic detector, an electronic circuit for decoding the detected magnetic variations corresponding to knob rotation, and a frame upon which the knob and magnetic sensor are mounted. In a preferred embodiment, the knob is designed in such a manner as to provide an environmental seal between the front and rear side of the frame to which it is mounted.

7 Claims, 2 Drawing Sheets

APPARATUS FOR MAGNETICALLY TRANSFERRING CONTROL INFORMATION FROM A ROTARY KNOB

FIELD OF THE INVENTION

This invention relates generally to the field of electrical devices, and more particularly to an apparatus for magnetically transferring control information from a rotary knob.

BACKGROUND OF THE INVENTION

Control information for electronic devices of an analog nature is commonly achieved by the use of a rotary or linear potentiometer. By adjusting such a device, an analog signal such as an audio signal can be directly affected by the potentiometer and thereby attenuated or amplified as a function of the position of the potentiometer. Control of other parameters or non audio signals can be accomplished by using the potentiometer to vary a DC voltage or current which interfaces to some controlling circuitry. With the acceptance and proliferation of digital systems it has become necessary to input control signals in a digital manner. While it is possible to convert an analog voltage from a potentiometer to a digital signal which can be interpreted by digital controller, this method can be costly and limited.

A simple method for sending control information to a digital system can be accomplished by the use of a momentary push switch. Commonly, two such push switches have been used to allow a user of an automotive radio system, for example, to increase or decrease the volume. Pushing the up switch once would increase the volume by a predetermined amount while holding the switch will ramp the volume up at a given rate. The same would apply for the volume down switch. Switches are sometimes seen as undesirable for use as audio controls and many manufacturers have opted to use a rotary encoder in order to transfer the user input to the control circuit. A typical rotary encoder has two internal contacts arranged in a quadrature configuration. As the shaft is rotated, the switches make and break consecutively. Use of a quadrature decoder circuit or software algorithm can then be used to determine the direction and rate of rotation.

A conventional rotary switch mechanism has certain aspects of its construction which can make it a less desirable input device for digital control information. The construction of such a mechanical encoder tends to be costly, requiring very small and precise switch contacts and rotary mechanism. In addition, because it is a mechanical device, it is subject to wear and the effects of the environment. The conventional through shaft design makes it difficult to seal the switch chamber against the elements.

SUMMARY OF THE INVENTION

The primary object of the invention is to provide a means of transferring information from a rotary knob through a surface without having to permeate said surface.

Another object of the invention is to provide a rotary encoder which accomplishes an environmental (e.g., water tight) seal.

Another object of the invention is to provide a rotary encoder and associated knob which is more economical than conventional switch contact design.

Another object of the invention is to provide a rotary encoder with increased reliability over conventional switch contact devices.

A further object of the invention is to provide a rotary encoder and associated circuitry which can directly replace push button switches which are used for incrementing or decrementing parameters of a digitally controlled system.

Other objects and advantages of the present invention will become apparent from the following descriptions, taken in connection with the accompanying drawings, wherein, by way of illustration and example, an embodiment of the present invention is disclosed.

The present invention can be integrated into a design without having to permeate the panel upon which it is mounted. The invention thus allows for a more economical, more reliable, and more flexible solution.

This invention features an apparatus for magnetically transferring control information from a rotary knob comprising: a knob mounted in a manner which facilitates rotation, a magnetic material about the circumference of the knob with alternating field lines perpendicular to the direction of knob rotation, a magnetic detector, an electronic circuit for decoding the detected magnetic variations corresponding to knob rotation, and a frame upon which the knob and magnetic sensor are mounted.

The drawings constitute a part of this specification and include exemplary embodiments to the invention, which may be embodied in various forms. It is to be understood that in some instances various aspects of the invention may be shown exaggerated or enlarged to facilitate an understanding of the invention.

DETAILED DESCRIPTION OF THE PREFERRED EMBODIMENTS

Detailed descriptions of the preferred embodiments are provided herein. It is to be understood, however, that the present invention may be embodied in various forms. Therefore, specific details disclosed herein are not to be interpreted as limiting, but rather as a basis for the claims and as a representative basis for teaching one skilled in the art to employ the present invention in virtually any appropriately detailed system, structure or manner.

Figure 1:
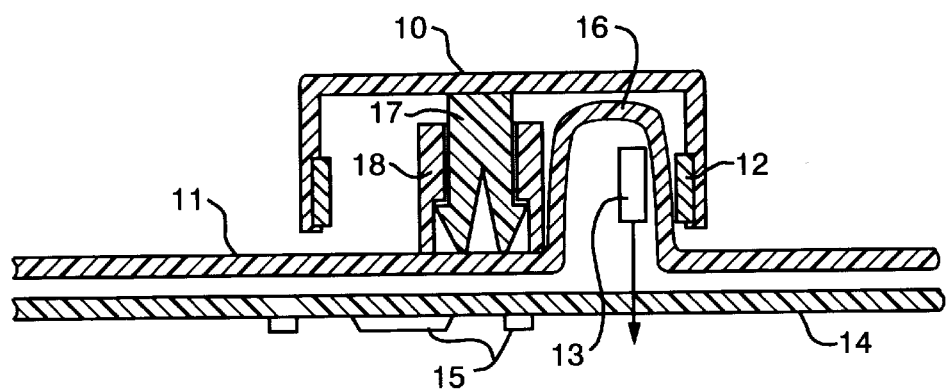
FIG. 1 is a cross sectional view of an apparatus for magnetically transferring control information from a rotary knob according to this invention.
Figure 4:
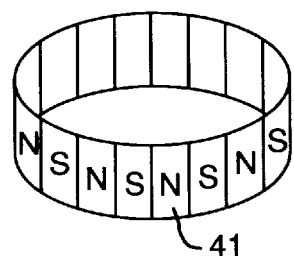
FIG. 4 is a perspective view of the magnetic material component with alternating magnetic field lines, of the invention of FIG. 1.

Turning to FIG. 1, there is shown a cross sectional view of one embodiment of the invention. Annular knob 10 is mounted to front panel 11 in such a manner that it is free to rotate. Cylindrical knob center post 17 is mounted within raised front panel feature 18 the combination of which creates a bearing surface to guide the rotation of the knob with respect to the front panel. Magnetic material 12 is fixed to the knob such that as the knob is rotated, the alternating magnetic field lines pass by the magnetic sensor 13. The magnetic material is shown in perspective view in FIG. 4, and comprises a ring of alternating N and S poles. The density of the alternating magnetic polarization 41 can be varied in order to affect the angular resolution of the invention. Panel or frame 11 is formed with a pocket 16 such that the magnetic sensor can be positioned in close proximity to the magnetic material, within the interior of knob 10, without the need to make an opening in the front panel material, thereby insuring an environmental (e.g., water tight) seal. Sensor 13 is mounted to a printed circuit board 14 upon which is also mounted the electronic decoding components 15.

Figure 6:
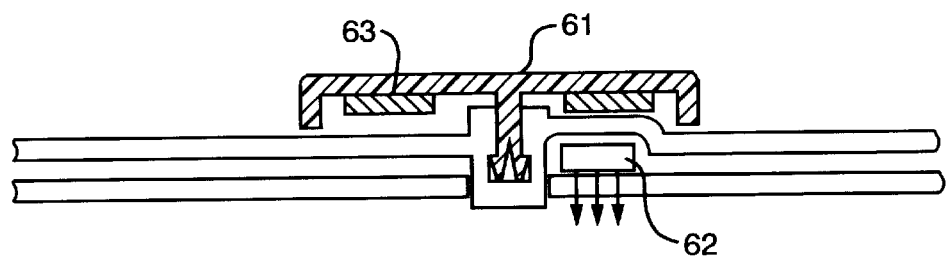
FIG. 6 is a cross sectional view of an embodiment of the invention in which the magnetic material configuration depicted in FIG. 5 is incorporated
Figure 5:
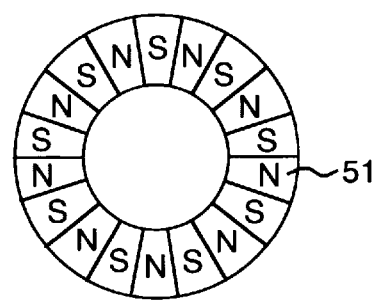
FIG. 5 is a plan view of an alternate embodiment of the magnetic material component of FIG. 4.

FIG. 5 shows an alternative embodiment, in which the magnetic material is formed in a flat, washer arrangement 63, with the magnetic polarization 51 formed radially about the circumference. This variation would allow the knob assembly to take on a lower profile as shown in FIG. 6. Magnetic material 63 rotates past flat mounted magnetic sensor 62 enabling detection.

Figure 3:
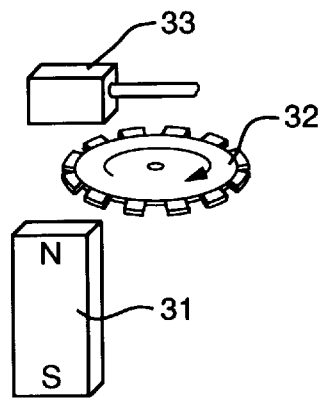
FIG. 3 is an exploded view of an embodiment of the invention in which a rotating toothed ferrous ring and a stationary dipole magnet are used.

FIG. 3 illustrates and alternate detection scheme in which the rotating polarized magnetic material is replaced with a ferrous toothed washer 32, on one side of which is statically mounted a permanent magnet 31. As the washer is rotated, variations are produced in the magnetic field and detected by magnetic sensor 33.

Figure 2:
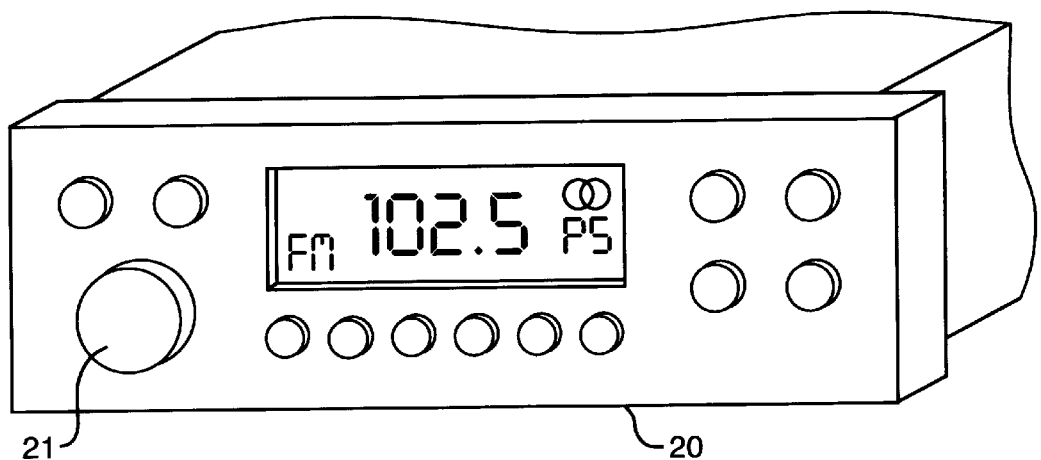
FIG. 2 is a perspective view of an apparatus for magnetically transferring control information from a rotary knob according to this invention, implemented in an automotive style radio head unit.

A preferred embodiment of the invention is illustrated in FIG. 2. In this application the invention is being used to control the volume and possibly other audio parameters (e.g., the tone) for an automotive style radio head unit. A common application for such a product could subject the unit to weather and harsh environments, for example marine applications. The invention can allow for implementation of an audio control knob while resisting water permeation through the front panel into sensitive electronics behind.

While the invention has been described in connection with a preferred embodiment, it is not intended to limit the scope of the invention to the particular form set forth, but on the contrary, it is intended to cover such alternatives, modifications, and equivalents as may be included within the spirit and scope of the invention as defined by the appended claims.

What is claimed is:

1. An apparatus for magnetically transferring control information from a rotary knob comprising:

an impermeable frame;

a knob mounted on one side of said frame to rotate in a plane;

a magnetic material about the circumference of the knob with alternating field lines perpendicular to the plane of rotation of said knob;

wherein said frame includes a pocket located underneath said knob;

a magnetic detector on the other side of said frame from said knob and within said pocket, for detecting magnetic variations as said knob is rotated; and an electronic circuit for decoding the detected magnetic variations corresponding to knob rotation.

2. The apparatus for magnetically transferring control information from a rotary knob of claim 1, wherein said knob defines an interior volume, and said magnetic detector is located within said interior volume.

3. The apparatus for magnetically transferring control information from a rotary knob of clam 1, further comprising a PC board mounted behind said frame which houses said magnetic sensor and said electronic circuitry.

4. The apparatus for magnetically transferring control information from a rotary knob of claim 1, wherein said knob functions as a volume or tone control for an audio component.

5. The apparatus for magnetically transferring control information from a rotary knob of claim 1, wherein said electronic decoding circuit includes a microprocessor IC.

6. The apparatus for magnetically transferring control information from a rotary knob of claim 1, wherein said magnetic material is formed in the shape of a flat washer with the alternating field lines imprinted radially a long its face.

7. An apparatus for magnetically transferring control information from a rotary knob comprising:

an impermeable frame;

a knob mounted on one side of said frame to rotate in a plane, and carrying a ferrous toothed ring;

a fixed magnetic member located on one side of said ring;

wherein said frame includes a pocket located underneath said knob;

a magnetic detector on the other side of said frame from said knob and within said pocket, and located on the other side of said ring, so that the rotation of said ring along with said knob produces magnetic flux variations, said magnetic detector detecting magnetic variations as said knob is rotated; and an electronic circuit for decoding the detected magnetic variations corresponding to knob rotation.

* * * * *